(12) United States Patent
Huang

(10) Patent No.: US 11,296,246 B2
(45) Date of Patent: Apr. 5, 2022

(54) PHOTOSENSITIVE COMPONENT, DETECTION SUBSTRATE AND METHOD FOR MANUFACTURING THE SAME

(71) Applicant: BOE TECHNOLOGY GROUP CO., LTD., Beijing (CN)

(72) Inventor: Rui Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 309 days.

(21) Appl. No.: 16/487,823

(22) PCT Filed: Feb. 14, 2019

(86) PCT No.: PCT/CN2019/075025
§ 371 (c)(1),
(2) Date: Aug. 21, 2019

(87) PCT Pub. No.: WO2020/010846
PCT Pub. Date: Jan. 16, 2020

(65) Prior Publication Data
US 2021/0336071 A1 Oct. 28, 2021

(30) Foreign Application Priority Data
Jul. 10, 2018 (CN) .......................... 201810752989.X

(51) Int. Cl.
*H01L 31/0232* (2014.01)
*H01L 27/146* (2006.01)
(Continued)

(52) U.S. Cl.
CPC .... *H01L 31/02327* (2013.01); *H01L 27/1464* (2013.01); *H01L 27/14603* (2013.01);
(Continued)

(58) Field of Classification Search
None
See application file for complete search history.

(56) References Cited

U.S. PATENT DOCUMENTS 5,288,989 A * 2/1994 Ishaque ............. H01L 31/02161
250/208.1
8,129,213 B2 3/2012 Ikeda et al.
(Continued)

FOREIGN PATENT DOCUMENTS

CN 101645451 A 2/2010
CN 101661946 A 3/2010
(Continued)

OTHER PUBLICATIONS

First Chinese Office Action dated Aug. 5, 2019, received for corresponding Chinese Application No. 201810752989.X, 21 pages.

*Primary Examiner* — Andres Munoz
(74) *Attorney, Agent, or Firm* — Kinney & Lange, P.A.

(57) ABSTRACT

The present disclosure relates to a photosensitive component, a detection substrate and a method for manufacturing the detection substrate. The photosensitive component includes: a first electrode layer, a photoelectric conversion layer, a second electrode layer, an insulating layer and a reflective layer. The photoelectric conversion layer is located on the first electrode layer. The second electrode layer is located on a surface of the photoelectric conversion layer away from the first electrode layer. The insulating layer covers side surfaces of the photoelectric conversion layer and at least a part of a surface of the second electrode layer away from the photoelectric conversion layer, and the insulating layer includes a transparent material. The reflective layer covers the insulating layer, and the reflective layer is configured to reflect at least a part of light entering the insulating layer to the side surfaces of the photoelectric conversion layer.

15 Claims, 13 Drawing Sheets

(51) Int. Cl.
*H01L 31/02* (2006.01)
*H01L 31/0216* (2014.01)
*H01L 31/0224* (2006.01)

(52) U.S. Cl.
CPC .. *H01L 27/14629* (2013.01); *H01L 27/14685* (2013.01); *H01L 27/14692* (2013.01); *H01L 31/02005* (2013.01); *H01L 31/02161* (2013.01); *H01L 31/022408* (2013.01); *H01L 27/14612* (2013.01); *H01L 27/14663* (2013.01)

(56) References Cited

U.S. PATENT DOCUMENTS

| | | | |
|---|---|---|---|
| 9,437,742 B2* | 9/2016 | Yan | H01L 29/7869 |
| 10,038,022 B1* | 7/2018 | Chen | H01L 27/14649 |
| 10,964,722 B2* | 3/2021 | Xia | H01L 25/0753 |
| 2010/0032659 A1 | 2/2010 | Yoshida | |
| 2012/0061578 A1* | 3/2012 | Lim | H01L 27/14663 250/370.14 |
| 2014/0231804 A1* | 8/2014 | Yan | H01L 27/14616 257/53 |
| 2016/0163747 A1 | 6/2016 | Koide | |
| 2017/0236857 A1 | 8/2017 | Bu | |

FOREIGN PATENT DOCUMENTS

| | | |
|---|---|---|
| CN | 105140250 A | 12/2015 |
| CN | 105679842 A | 6/2016 |
| CN | 107910342 A | 4/2018 |
| CN | 108878572 A | 11/2018 |
| JP | 62235588 A | 10/1987 |
| JP | 2002139568 A | 5/2002 |
| JP | 2002139598 A | 5/2002 |
| JP | 2004301516 A | 10/2004 |
| KR | 20100036693 A | 4/2010 |
| WO | WO-2020150938 A1 * | 7/2020 ............... G06K 9/00 |

* cited by examiner

PHOTOSENSITIVE COMPONENT, DETECTION SUBSTRATE AND METHOD FOR MANUFACTURING THE SAME

CROSS-REFERENCE TO RELATED APPLICATION

This application is a Section 371 National Stage Application of International Application No. PCT/CN2019/075025, filed on Feb. 14, 2019, entitled "PHOTOSENSITIVE COMPONENT, DETECTION SUBSTRATE AND METHOD FOR MANUFACTURING THE SAME", which claims the benefit of Chinese Patent Application No. 201810752989.X, filed on Jul. 10, 2018, the whole disclosure of which is incorporated herein by reference.

TECHNICAL FIELD

The present disclosure relates to the field of photoelectric technology, and in particular to a photosensitive component, a detection substrate, and a method for manufacturing a detection substrate.

BACKGROUND

An X-ray detection device includes a common photoelectric detection device of indirect conversion type, which is generally applied in fields of medical treatment, industrial production and the like. An X-ray detection substrate is a core component of the X-ray detection device. Currently, the X-ray detection substrate generally includes a photodiode, a thin film transistor (abbreviated as TFT), and the like. The photodiode may convert visible light into an electrical signal, and the thin film transistor may receive the electrical signal and output the received electrical signal to display an image. However, the existing photodiode has a low utilization rate of light, so that a photocurrent is small, thus it is difficult to increase a signal-to-noise ratio of the X-ray detection substrate.

SUMMARY

In an aspect, a photosensitive component is provided, including: a first electrode layer; a photoelectric conversion layer on the first electrode layer; a second electrode layer on a surface of the photoelectric conversion layer away from the first electrode layer; an insulating layer covering side surfaces of the photoelectric conversion layer and at least a part of a surface of the second electrode layer away from the photoelectric conversion layer, the insulating layer including a transparent material; and a reflective layer covering the insulating layer, the reflective layer being configured to reflect at least a part of light entering the insulating layer to the side surfaces of the photoelectric conversion layer.

Optionally, a surface of the reflective layer opposite to the side surfaces of the photoelectric conversion layer is convex in a direction away from the photoelectric conversion layer.

Optionally, the surface of the reflective layer opposite to the side surfaces of the photoelectric conversion layer is an arc surface.

Optionally, a surface of the reflective layer opposite to the side surfaces of the photoelectric conversion layer is an inclined surface.

Optionally, the photosensitive component further includes a conductive plug between the reflective layer and the second electrode layer, wherein the reflective layer is electrically connected to the second electrode layer through the conductive plug.

Optionally, the photosensitive component further includes a protective layer covering the side surfaces of the photoelectric conversion layer and the at least a part of the surface of the second electrode layer away from the photoelectric conversion layer, the insulating layer covering the protective layer.

Optionally, a material of the reflective layer includes metal.

Optionally, the photoelectric conversion layer includes: a first semiconductor layer on the first electrode layer; an intrinsic semiconductor layer on a side of the first semiconductor layer away from the first electrode layer, and a second semiconductor layer on a side of the intrinsic semiconductor layer away from the first electrode layer.

In another aspect, a detection substrate is provided, including: a base substrate; and the photosensitive component according to the above aspect, wherein the first electrode layer is disposed on the base substrate.

Optionally, the detection substrate further includes a thin film transistor connected to the photosensitive component, the thin film transistor including a gate electrode, a source electrode and a drain electrode.

Optionally, the photosensitive component further includes a conductive plug between the reflective layer and the second electrode layer, and the reflective layer is electrically connected to the second electrode layer through the conductive plug.

Optionally, one of the source electrode and the drain electrode is electrically connected to the reflective layer.

Optionally, one of the source electrode and the drain electrode is electrically connected to the first electrode layer.

Optionally, the thin film transistor further includes a gate insulating layer and an active layer, the gate electrode is disposed on the base substrate, the gate insulating layer is disposed on a side of the gate electrode away from the base substrate, the active layer is disposed on a side of the gate insulating layer away from the gate electrode, and the source electrode and the drain electrode are disposed on a side of the active layer away from the gate insulating layer; and wherein the gate electrode and the reflective layer are located in the same layer.

Optionally, an orthographic projection of the gate electrode on the base substrate overlaps with an orthographic projection of the first electrode layer on the base substrate, and the orthographic projection of the gate electrode on the base substrate falls within an orthographic projection of the insulating layer on the base substrate.

Optionally, the photosensitive component further includes a protective layer covering the side surfaces of the photoelectric conversion layer and the at least a part of the surface of the second electrode layer away from the photoelectric conversion layer, the insulating layer covering the protective layer.

Optionally, an orthographic projection of the gate electrode on the base substrate overlaps with an orthographic projection of the first electrode layer on the base substrate, and the orthographic projection of the gate electrode on the base substrate falls within an orthographic projection of the protective layer on the base substrate.

Optionally, both the source electrode and the drain electrode are in the same layer as the reflective layer.

Optionally, the thin film transistor further includes a gate insulating layer and an active layer, the source electrode and the drain electrode are disposed on the base substrate, the active layer is disposed on a side of both the source electrode and the drain electrode away from the base substrate, the gate insulating layer is disposed on a side of the active layer away from the base substrate, and the gate electrode is disposed on a side of the gate insulating layer away from the active layer; and wherein both the source electrode and the drain electrode are located in the same layer as the reflective layer.

Optionally, the thin film transistor further includes a gate insulating layer and an active layer, the source electrode and the drain electrode are disposed on the base substrate, the active layer is disposed on a side of both the source electrode and the drain electrode away from the base substrate, the gate insulating layer is disposed on a side of the active layer away from the base substrate, and the gate electrode is disposed on a side of the gate insulating layer away from the active layer; and wherein both the source electrode and the drain electrode are located in the same layer as the first electrode layer.

Optionally, the detection substrate further includes: a passivation layer covering both the thin film transistor and the photosensitive component; and a planarization layer covering the passivation layer.

In still another aspect, a detector is provided, wherein the detector includes the detection substrate according to the above aspect.

In another further aspect, a method for manufacturing a detection substrate is provided, wherein the method includes: forming a first electrode layer on a base substrate; forming a photoelectric conversion layer on a surface of the first electrode layer away from the base substrate; forming a second electrode layer on a surface of the photoelectric conversion layer away from the base substrate; forming an insulating layer covering side surfaces of the photoelectric conversion layer and at least a part of a surface of the second electrode layer away from the photoelectric conversion layer, the insulating layer including a transparent material; and forming a reflective layer covering the insulating layer, the reflective layer being configured to reflect at least a part of light entering the insulating layer to the side surfaces of the photoelectric conversion layer.

Optionally, the method further includes: forming a thin film transistor on the base substrate, wherein forming the thin film transistor on the base substrate includes: forming a gate electrode, a source electrode, and a drain electrode of the thin film transistor on the base substrate.

Optionally, the gate electrode and the reflective layer are formed through the same one patterning process.

Optionally, both the source electrode and the drain electrode are formed through the same one patterning process as the reflective layer.

Optionally, both the source electrode and the drain electrode are formed through the same one patterning process as the first electrode layer.

BRIEF DESCRIPTION OF THE DRAWINGS

Herein, accompanying drawings, which are incorporated in the specification, are used to illustrate embodiments of the present disclosure, and are intended to explain principles of the present disclosure in combination with the specification. Obviously, the drawings described hereinafter are merely a part of the embodiments of the present disclosure, and other drawings may be obtained based on these drawings by those skilled in the art without any creative work.

DETAILED DESCRIPTION OF EMBODIMENTS

Figure 1:
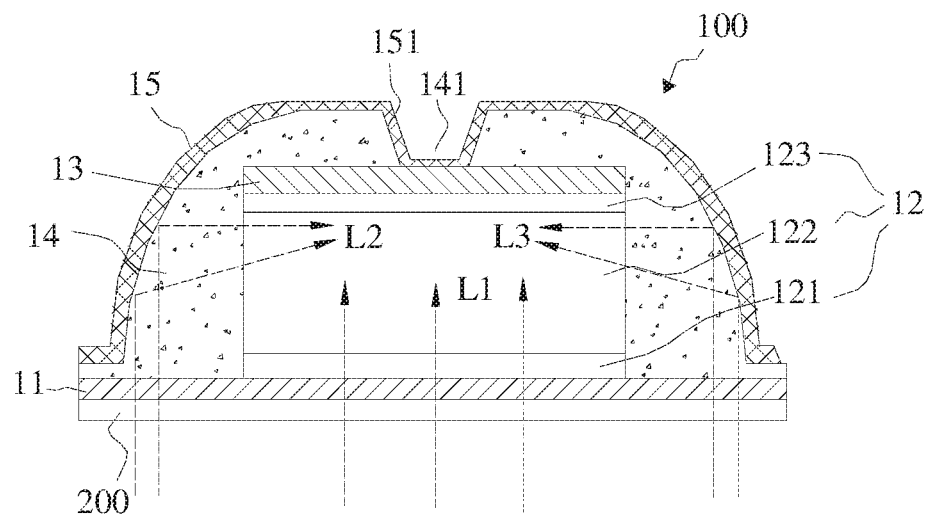
FIG. 1 is a schematic cross-sectional view of a photosensitive component according to some embodiments of the present disclosure.

Exemplary embodiments will be described more fully with reference to accompanying drawings. However, the exemplary embodiments may be implemented in a variety of forms and should not be construed as being limited to embodiments set forth herein. These embodiments are provided to make the present disclosure be comprehensive and full, and to convey an inventive concept of the exemplary embodiments to those skilled in the art fully. The same reference numerals in the drawings denote the same or similar structures, and thus their detailed description will be omitted.

Although relative terms such as "upper" and "lower" are used in the specification to describe a relative relationship between one component and another component shown in the drawings, these terms are used in the specification only for convenience of description, for example, the description may be made based on exemplary directions shown in the drawings. It will be understood that, if the device shown in the drawings is flipped upside down, a component described by the term "upper" may become a component described by the term "lower". When a structure is "on" another structure, it may mean that the structure is integrally formed on the another structure, or that the structure is "directly" disposed on the another structure, or that the structure is "indirectly" disposed on the another structure.

The terms "a", "an", "the", "said" are used to express the presence of one or more elements, components, or the like. The terms "include", "comprise" and "have" are used to express a meaning of open-ended inclusion, that is, they are meant that there may be additional elements, components or the like, in addition to the listed elements, components or the like. The terms "first" and "second" are used to only indicate different components, and they should not be construed as limiting an amount of the components.

Herein, unless otherwise stated, an expression "(a first component and a second component are) in the same layer" generally means that the first component and the second component may be formed by the same patterning process. For example, the expression "a gate electrode and a reflective layer are in the same layer" generally means that the gate electrode and the reflective layer may be formed by the same patterning process.

X-ray detection technology is widely used in fields such as medical treatment, safety inspection and non-destructive inspection. At present, the most widely used X-ray detection technology is digital radiography (abbreviated as DR) technology that appeared in the late 1990s. The DR technology includes direct conversion DR technology and indirect conversion DR technology. A DR system based on indirect conversion DR technology includes an X-ray generator, a detector, a system controller, an image monitor, and the like.

In the related art, the detector of the DR system based on indirect conversion DR technology includes a detection substrate and structures, such as scintillator layer (or phosphor layer), disposed on the detection substrate. The detection substrate generally includes a base substrate, and a photodiode and a thin film transistor (abbreviated as TFT) on the base substrate. When the detector is in operation, the detector is irradiated with X-ray, and the scintillator layer (or the phosphor layer) converts the X-ray into visible light. The photodiode detects the visible light, converts the visible light into an electrical signal, and then transmits the electrical signal to the thin film transistor.

The thin film transistor may receive the electrical signal and output the electrical signal so that the image monitor may display an image. The photodiode may include a first transparent electrode layer, an N-type amorphous silicon layer, an intrinsic amorphous silicon layer, a P-type amorphous silicon layer and a second transparent electrode layer, which are disposed in a stacked manner. Light is incident from a side of the first transparent electrode layer away from the N-type amorphous silicon layer, so that the light is required to pass through the first transparent electrode layer and the N-type amorphous silicon layer to be irradiated onto the intrinsic amorphous silicon layer in order to achieve photoelectric conversion. In this process, only light passing through the first transparent electrode layer and the N-type amorphous silicon layer may be utilized, and light incident on other regions may not be utilized, resulting in loss of light energy. Therefore, it is disadvantageous for improving photocurrent and it is difficult to increase a signal-to-noise ratio of the detection substrate.

Some embodiments of the present disclosure provide a photosensitive component, which may be a photodiode. As shown in FIG. 1, the photosensitive component 100 according to the embodiments of the present disclosure may be formed on a base substrate 200, and the photosensitive component 100 may include a first electrode layer 11, a photoelectric conversion layer 12, a second electrode layer 13, an insulating layer 14, and a reflective layer 15. The photoelectric conversion layer 12 may be disposed on the first electrode layer 11, for example, on a surface of the first electrode layer 11 away from the base substrate 200. The second electrode layer 13 may be disposed on a surface of the photoelectric conversion layer 12 away from the first electrode layer 11.

The insulating layer 14 may cover side surfaces of the photoelectric conversion layer 12 and at least a part of a surface of the second electrode layer 13 away from the photoelectric conversion layer 12, and the insulating layer 14 has a transparent material.

The reflective layer 15 covers the insulating layer 14 and serves to reflect at least a part of light entering the insulating layer 14 to the side surfaces of the photoelectric conversion layer 12.

As shown in FIG. 1, in the photosensitive component 100 according to the embodiments of the present disclosure, on the one hand, light (for example, light ray L1 as shown in FIG. 1) may pass through the first electrode layer 11 to be irradiated onto a surface of the photoelectric conversion layer 12 close to the first electrode layer 11; on the other hand, the reflective layer 15 may reflect at least a part of light entering the insulating layer 14 (for example, light rays L2 and L3 as shown in FIG. 1) to the side surfaces of the photoelectric conversion layer 12, so that a bottom surface, the side surfaces or even a top surface of the photoelectric conversion layer 12 may receive light. In this way, an area of the photoelectric conversion layer 12 to receive light is enlarged, thereby generating a large photocurrent, thus it is advantageous for increasing the signal-to-noise ratio of the detection substrate.

Hereinafter, each part of the photosensitive component 100 according to the embodiments of the present disclosure will be described in detail.

As shown in FIG. 1, the first electrode layer 11 may have a transparent conductive material such as ITO (Indium Tin Oxide) or the like, so that the light may pass through the first electrode layer 11. The first electrode layer 11 may be formed on a transparent base substrate 200. Moreover, the first electrode layer 11 may be formed by a process such as vapor deposition, evaporation, or the like, and a size and a shape thereof are not particularly limited herein.

As shown in FIG. 1, the photoelectric conversion layer 12 may be disposed on the first electrode layer 11, for example, on the surface of the first electrode layer 11 away from the base substrate 200. The photoelectric conversion layer 12 is capable of converting an optical signal into an electrical signal when it is irradiated with light. The photoelectric conversion layer 12 may include a first semiconductor layer 121, an intrinsic semiconductor layer 122, and a second semiconductor layer 123.

As shown in FIG. 1, the first semiconductor layer 121 may be a semiconductor layer which is formed by performing N-type/P-type doping on a semiconductor material such as amorphous silicon, amorphous germanium or a compound thereof; or may directly employ a semiconductor material such as silicon, germanium, a compound thereof, or the like; or may also employ a semiconductor material such as IGZO, ZnO, ITGO or the like.

The first semiconductor layer 121 may be disposed on the first electrode layer 11, for example, on the surface of the first electrode layer 11 away from the base substrate 200. The first semiconductor layer 121 may be formed by a process such as vapor deposition, evaporation, doping, or the like, and is not particularly limited herein.

The intrinsic semiconductor layer 122 may employ a semiconductor material such as amorphous silicon, amorphous germanium or a compound thereof. The intrinsic semiconductor layer 122 may be disposed on a side of the first semiconductor layer 121 away from the first electrode layer 11, for example, on a surface of the first semiconductor layer 121 away from the first electrode layer 11. The intrinsic semiconductor layer 122 may be formed by a process such as vapor deposition, evaporation, or the like.

The second semiconductor layer 123 may be a semiconductor layer which is formed by performing N-type/P-type doping on a semiconductor material such as silicon, germanium or a compound thereof; or may employ a semiconductor material such as silicon, germanium, a compound thereof, or the like; or may also employ a semiconductor material such as IGZO, ZnO or the like.

The second semiconductor layer 123 may be disposed on the intrinsic semiconductor layer 122 away from the first electrode layer 11, for example, on a surface of the intrinsic semiconductor layer 122 away from the first electrode layer 11. The second semiconductor layer 123 may be formed by a process such as vapor deposition, evaporation, doping, or the like.

It should be noted that, if the first semiconductor layer 121 is an N-type semiconductor layer, then the second semiconductor layer 123 is a P-type semiconductor layer; if the first semiconductor layer 121 is a P-type semiconductor layer, then the second semiconductor layer 123 is an N-type Semiconductor layer.

In connection with the above descriptions, the photoelectric conversion layer 12 may include the first semiconductor layer 121, the intrinsic semiconductor layer 122, and the second semiconductor layer 123 which are stacked on the first electrode layer 11. Moreover, a side surface of the first semiconductor layer 121, a side surface of the intrinsic semiconductor layer 122, and a side surface of the second semiconductor layer 123 may be aligned with one another, that is, any one of the side surfaces of the photoelectric conversion layer 12 may be a flat surface.

As shown in FIG. 1, the second electrode layer 13 may have a transparent conductive material, such as ITO (indium tin oxide) or the like, so that light may pass through the second electrode layer 13. The second electrode layer 13 may be disposed on a surface of the photoelectric conversion layer 12 away from the first electrode layer 11, and the second electrode layer 13 may completely cover the surface, for example, the second electrode layer 13 may completely cover a surface of the second semiconductor layer 123 away from the intrinsic semiconductor layer 122. Moreover, the second electrode layer 13 may be formed by a process such as vapor deposition, evaporation, or the like. Side surfaces of the second electrode layer 13 may be aligned with the side surfaces of the photoelectric conversion layer 12, respectively.

As shown in FIG. 1, the insulating layer 14 may cover a part or all of a surface of the second electrode layer 13 away from the photoelectric conversion layer 12. Optionally, the insulating layer 14 may not cover the surface of the second electrode layer 13 away from the photoelectric conversion layer 12. Moreover, the insulating layer 14 may also cover the side surfaces of the photoelectric conversion layer 12. Light passing through the first electrode layer 11 and located sidewise with regard to the photoelectric conversion layer 12 may enter the insulating layer 14 without passing through the photoelectric conversion layer 12, so that the loss of light energy may be reduced. A material of the insulating layer 14 may include a resin, and of course, may also include other transparent and insulating materials.

An outer surface of the insulating layer 14 may be convex in a direction away from the photoelectric conversion layer 12. The outer surface of the insulating layer 14 may be a smooth curved surface such as an arc surface, or may be other surfaces such as a facet, or the like. For example, the outer surface of the insulating layer 14 may be a hemisphere surface or a paraboloid surface. In this way, the second electrode layer 13 and the photoelectric conversion layer 12 may be housed inside the insulating layer 14.

As shown in FIG. 1, the reflective layer 15 may cover the insulating layer 14, and may reflect at least a part of light entering the insulating layer 14 (for example, light rays L2 and L3 as shown in FIG. 1) to the side surfaces of the photoelectric conversion layer 12, so that light located sidewise with regard to the photoelectric conversion layer 12 is utilized to improve the utilization of light and to increase the photocurrent, in this way, it is advantageous for improving the signal-to-noise ratio of the detection substrate. Moreover, the light entering the insulating layer 14 through the first electrode layer 11 may be reflected by the reflective layer 15 to the side surfaces of the photoelectric conversion layer 12 without passing through the first semiconductor layer 121, thereby reducing the loss of light energy, in this way, it is advantageous for increasing the photocurrent, so that the signal-to-noise ratio is further improved.

Figure 5:
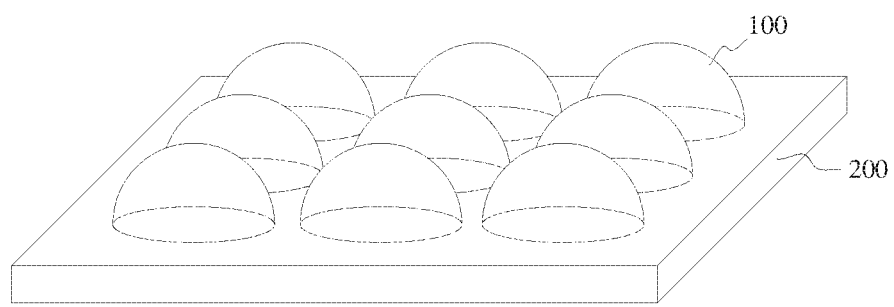
FIG. 5 is a schematic view showing a distribution of photosensitive components in a detection substrate according to some embodiments of the present disclosure.

For example, the reflective layer 15 may include a non-transparent metallic material for reflecting light. As shown in FIG. 1, a surface of the reflective layer 15 opposite to the side surfaces of the photoelectric conversion layer 12 may be convex in a direction away from the photoelectric conversion layer 12, so that the light may be converged. In this way, the light may be reflected to the side surfaces of the photoelectric conversion layer 12 as much as possible. Optionally, a shape of the reflective layer 15 may conform to the outer surface of the insulating layer 14. For example, as shown in FIG. 5, the outer surface of the insulating layer 14 is a hemispherical surface or parabolic surface, so that the reflective layer 15 may have a hemispherical structure or parabolic structure, that is, the surface of the reflective layer 15 opposite to the side surfaces of the photoelectric conversion layer 12 is an arc surface.

Further, a via hole 141 is formed in the insulating layer 14 and the via hole 141 penetrates the insulating layer 14, and a part of the reflective layer 15 is formed in the via hole 141 to form a conductive plug 151 that connects the reflective layer 15 and the second electrode layer 13. Therefore, in the embodiments, in addition to reflecting light, the reflective layer 15 may also function as a conductive layer, and the reflective layer 15 is made of a conductive material, such as metal or the like, for electrically connecting the second electrode layer 13 and a source electrode or a drain electrode (which will be described in detail below) of the thin film transistor.

The via hole 141 may be located on a side of the second electrode layer 13 away from the photoelectric conversion layer 12 and penetrate the insulating layer 14. The number of the via hole 141 may be one or more. Accordingly, the number of the conductive plug 151 may be one or more, which is not particularly limited herein.

In the embodiments, the reflective layer 15 is formed directly on the insulating layer 14, and the shape of the reflective layer 15 conforms to the shape of the outer surface of the insulating layer 14. For example, if the outer surface of the insulating layer 14 is a hemispherical surface or parabolic surface, then the reflective layer 15 may have a hemispherical structure or parabolic structure conforming to the hemispherical surface or parabolic surface. Therefore, by providing the insulating layer 14, it facilitates forming the reflective surface of the reflective layer 15. Also, the insulating layer 14 may house the second electrode layer 13 and the photoelectric conversion layer 12 therein, so as to protect the second electrode layer 13 and the photoelectric conversion layer 12. Advantageously, it may protect the first semiconductor layer 121, the intrinsic semiconductor layer 122 and the second semiconductor layer 123 from water, oxygen, and the like. Further, the insulating layer 14 may electrically isolate the first electrode layer 11 from the reflective layer 15, so as to isolate the first electrode layer 11 from the second electrode layer 13 and one of the source electrode and the drain electrode which are electrically connected to the reflective layer 15.

Figure 2:
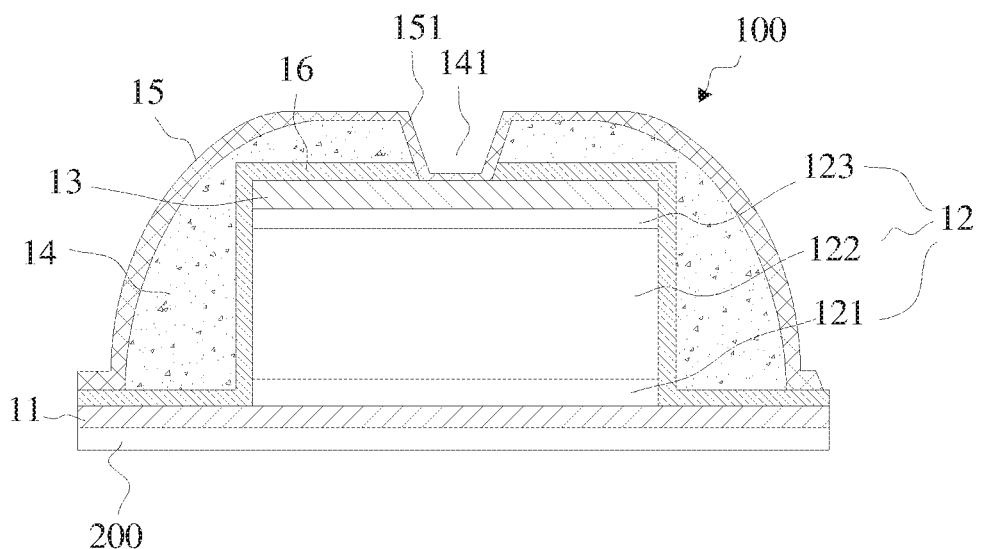
FIG. 2 is a schematic cross-sectional view of a photosensitive component including a protective layer, according to some embodiments of the present disclosure.

As shown in FIG. 2, the photosensitive component 100 according to some embodiments of the present disclosure may further include a protective layer 16 which is made of a transparent and insulating material. The protect layer 16 may cover the side surfaces of the photoelectric conversion layer 12 and cover all or a part of the surface of the second electrode layer 13 away from the photoelectric conversion layer 12. The insulating layer 14 may cover a part of the protective layer 16 corresponding to the side surfaces of the photoelectric conversion layer 12, and may also cover a part of the protective layer 16 corresponding to the second electrode layer 13. In this way, the side surfaces of the photoelectric conversion layer 12 and the surface of the second electrode layer 13 away from the photoelectric conversion layer 12 may be covered and protected by the protective layer 16 before the insulating layer 14 is formed. Advantageously, the protective layer 16 may house the second electrode layer 13 and the photoelectric conversion layer 12 therein, so as to protect the second electrode layer 13 and the photoelectric conversion layer 12. Advantageously, it may protect the first semiconductor layer 121, the intrinsic semiconductor layer 122 and the second semiconductor layer 123 from water, oxygen, or the like. For example, the protective layer 16 may be formed of an inorganic insulating material, and the insulating layer 14 may be formed of an organic insulating material.

As shown in FIG. 2, a via hole 141 is formed in the insulating layer 14 and the protective layer 16, and the via hole 141 penetrates both the insulating layer 14 and the protective layer 16, and a part of the reflective layer 15 is formed in the via hole 141 to form a conductive plug 151 connecting the reflective layer 15 and the second electrode layer 13. The via hole 141 may be located on the side of the second electrode layer 13 away from the photoelectric conversion layer 12 and penetrate both the insulating layer 14 and the protective layer 16. The number of the via hole 141 may be one or more. Accordingly, the number of the conductive plug 151 may be one or more, which is not particularly limited herein.

Optionally, as shown in FIG. 2, the protective layer 16 may also cover other parts of the first electrode layer 11, and the insulating layer 14 may be formed on the protective layer 16 so that it is not in direct contact with the first electrode layer 11. Optionally, a projection of the protective layer 16 on the first electrode layer 11 may be located within a projection of the insulating layer 14 on the first electrode layer 11, and the insulating layer 14 may be in direct contact with the first electrode layer 11.

Figure 3:
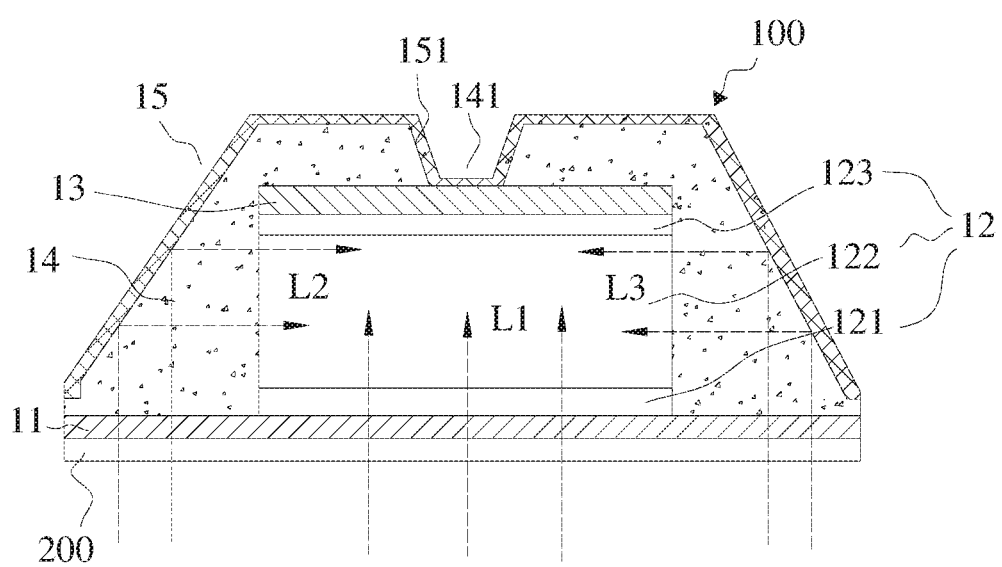
FIG. 3 is a schematic cross-sectional view of a photosensitive component in which a reflective layer has a structure of an inclined surface, according to some embodiments of the present disclosure.

As shown in FIG. 3, the outer surface of the insulating layer 14 may be an inclined surface, and the reflective layer 15 is directly formed on the outer surface of the insulating layer 14, so that the surface of the reflective layer 15 opposite to the side surfaces of the photoelectric conversion layer 12 is an inclined surface. In this way, the reflective layer 15 may still reflect at least a part of the light entering the insulating layer 14 (for example, the light rays L2 and L3 as shown in FIG. 3) to the side surfaces of the photoelectric conversion layer 12, so that the bottom surface, the side surfaces and even the top surface of the photoelectric conversion layer 12 may receive the light. In this way, an area of the photoelectric conversion layer 12 to receive light is enlarged, thereby generating a large photocurrent, thus it is advantageous for increasing the signal-to-noise ratio of the detection substrate.

Figure 4:
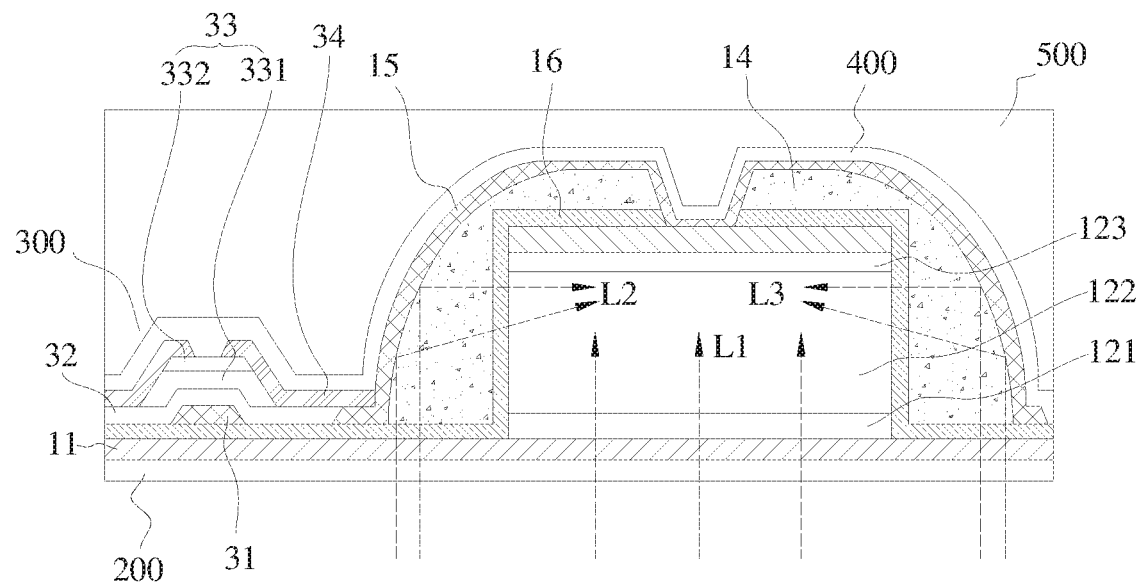
FIG. 4 is a schematic cross-sectional view of a detection substrate according to some embodiments of the present disclosure.

Embodiments of the present disclosure also provide a detection substrate, which may be a detection substrate for detecting X-rays based on DR technology. As shown in FIG. 4, the detection substrate may include a base substrate 200, a thin film transistor 300, and the photosensitive component 100 according to any of the above embodiments.

The base substrate 200 may be made of glass or other transparent materials, and its shape and size are not particularly limited herein.

As shown in FIG. 4, the first electrode layer 11 of the photosensitive component 100 may be disposed on the base substrate 200 and may cover all or a part of the base substrate 200. The specific structure of the photosensitive component 100 may refer to the above embodiments of the photosensitive component 100, which will not be described in detail herein.

As shown in FIG. 5, there are a plurality of the photosensitive components 100, and the photosensitive components 100 may be arranged on the base substrate 200 in an array. Each of the photosensitive components 100 may convert an optical signal into an electrical signal. Of course, there may be the photosensitive component 100 and other photosensitive components. Since the photosensitive component 100 may utilize the light located sidewise with regard to the photoelectric conversion layer 12, the photocurrent is increased, thereby improving the signal-to-noise ratio of the detection substrate so as to improve a detection effect.

As shown in FIG. 4, the thin film transistor 300 may be disposed on the base substrate 200 and located on the same surface of the base substrate 200 as the photosensitive component 100. Moreover, the thin film transistor 300 may be electrically connected to the photosensitive component 100 to receive an electrical signal output from the photosensitive component 100. In addition, the number of the thin film transistors 300 may be the same as the number of the photosensitive components 100. For example, there are a plurality of the thin film transistors 300 and a plurality of the photosensitive components 100, and the thin film transistors 300 and the photosensitive components 100 are arranged on the base substrate 200 in an array, respectively, and the thin film transistors 300 may be in a one-to-one correspondence with the photosensitive components 100, and each of the thin film transistors 300 is electrically connected to one corresponding photosensitive component 100.

Taking one thin film transistor 300 as an example, as shown in FIG. 4, the thin film transistor 300 may include a gate electrode 31, a gate insulating layer 32, an active layer 33, and a source/drain electrode 34.

For example, the gate electrode 31 may be disposed on a side of the base substrate 200 on which the photosensitive component 100 is disposed, and the gate electrode 31 and the reflective layer 15 may be formed through the same one patterning process. For example, as shown in FIG. 4, the protective layer 16 of the photosensitive component 100 may extend along the first electrode layer 11 in a direction away from the photoelectric conversion layer 12, and the gate electrode 31 may be formed on the protective layer 16. Specifically, both the first electrode layer 11 and the protective layer 16 extend along the first electrode layer 11 in the direction away from the photoelectric conversion layer 12, and an orthographic projection of a combination of the protective layer 16 and the via hole 141 formed in the protective layer 16 on the base substrate 200 covers an orthographic projection of the first electrode layer 11 on the base substrate 200. The gate electrode 31 is formed on the protective layer 16, and an orthographic projection of the gate electrode 31 on the base substrate 200 falls within an orthographic projection of the protective layer 16 on the base substrate 200. In the embodiments, the protective layer 16 functions to electrically isolate the first electrode layer 11 from the gate electrode 31.

Figure 6:
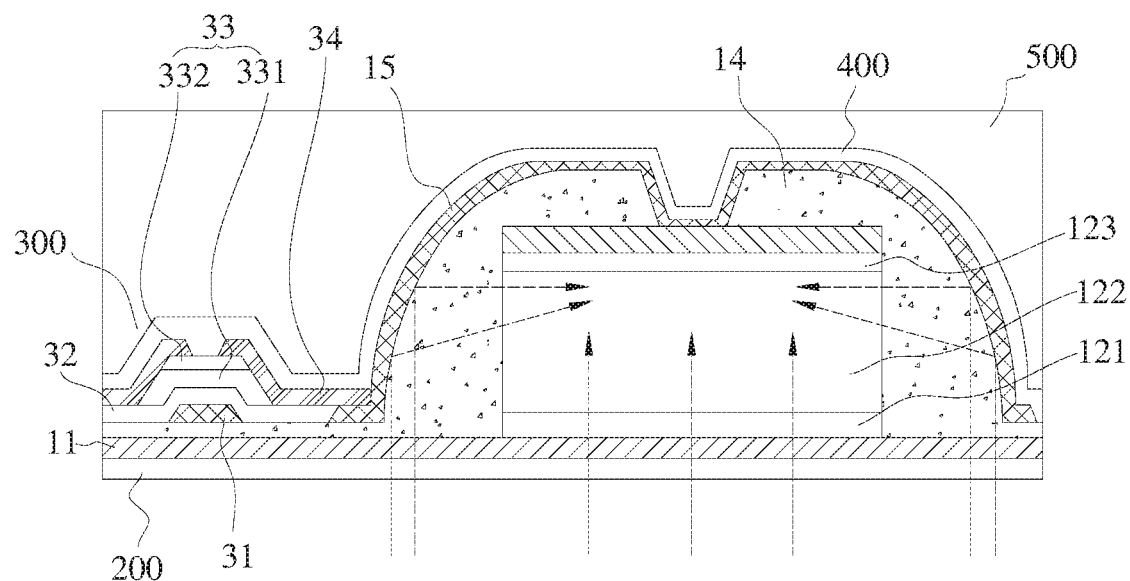
FIG. 6 is a schematic cross-sectional view of a detection substrate in which a photosensitive component does not include a separate protective layer, according to some embodiments of the present disclosure.

As shown in FIG. 6, in a case where the protective layer 16 is not formed separately, both the first electrode layer 11 and the insulating layer 14 may extend along the first electrode layer 11 in the direction away from the photoelectric conversion layer 12, and an orthographic projection of a combination of the insulating layer 14 and the via hole 141 formed in the insulating layer 14 on the base substrate 200 covers the orthographic projection of the first electrode layer 11 on the base substrate 200. The gate electrode 31 is formed on the insulating layer 14, and the orthographic projection of the gate electrode 31 on the base substrate 200 falls within an orthographic projection of the insulating layer 14 on the base substrate 200. In the embodiments, the insulating layer 14 functions to electrically isolate the first electrode layer 11 from the gate electrode 31.

Figure 7:
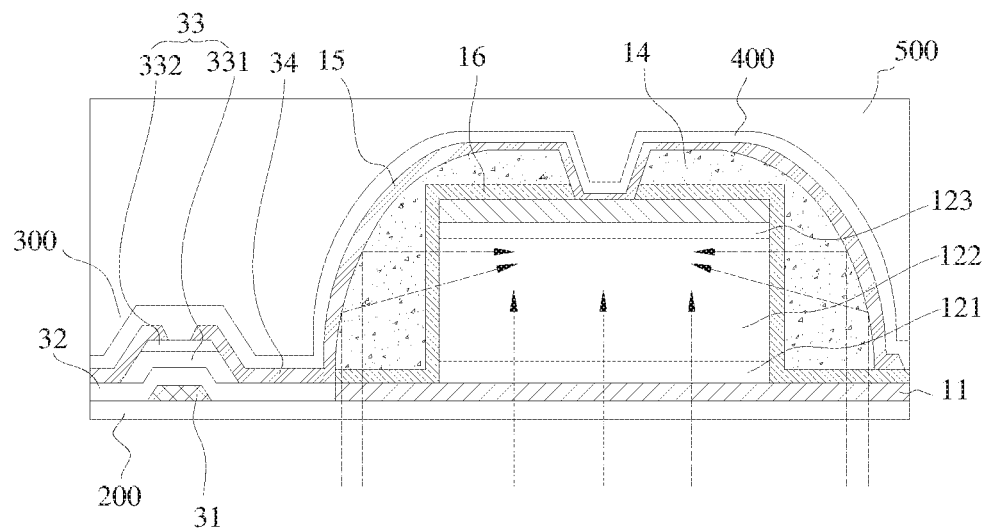
FIG. 7 is a schematic cross-sectional view of a detection substrate in which a gate electrode of a thin film transistor is directly disposed on a base substrate, according to some embodiments of the present disclosure.

Optionally, the first electrode layer 11, the protective layer 16 or the insulating layer 14 may not completely cover the base substrate 200, and the gate electrode 31 may be directly formed on the base substrate 200. That is, the orthographic projection of the gate electrode 31 on the base substrate 200 does not overlap with an orthographic projection of any one of the first electrode layer 11, the insulating layer 14, and the protective layer 16 on the base substrate 200, as shown in FIG. 7.

As shown in FIG. 4 and FIG. 6, the gate electrode 31 and the reflective layer 15 may be located in the same layer, that is, they may be formed through the same one patterning process (for example, a patterning process using a mask). Of course, the gate electrode 31 and the reflective layer 15 may also be formed separately.

The gate insulating layer 32 may be made of an insulating material and may cover the gate electrode 31.

The active layer 33 may be disposed on a side of the gate insulating layer 32 away from the gate electrode 31. Moreover, the active layer 33 may be made of a semiconductor material, and it may include an amorphous silicon layer 331 and a doped amorphous silicon layer 332, and the amorphous silicon layer 331 may be located between the doped amorphous silicon layer 332 and the gate insulating layer 32.

The source/drain electrode 34 may be made of a metal material and include a source electrode and a drain electrode. The source/drain electrode 34 may be disposed on a side of the active layer 33 away from the gate electrode 31. The source electrode or drain electrode may be connected to the reflective layer 15 of the photosensitive component 100. For example, in the illustrated embodiments, the drain electrode may be connected to the reflective layer 15. For example, the reflective layer 15 is formed of a conductive material, and the drain electrode is electrically connected to the second electrode layer 13 by means of the conductive reflective layer 15, so that an electrical signal output from the second electrode layer may be transmitted to the drain electrode of the thin film transistor. Specifically, when the detection substrate is in use, the photodiode detects the visible light (for example, light rays L1, L2, L3 as shown in the drawings) and converts the visible light into the electrical signal, and then the second electrode layer 13 transmits the electrical signal to the drain electrode of the thin film transistor 300.

As shown in FIG. 7, the source/drain electrode 34 and the reflective layer 15 may be located in the same layer, that is, they may be formed through the same one patterning process (for example, a patterning process using a mask). Of course, the source/drain electrode 34 and the reflective layer 15 may also be formed separately.

As shown in FIGS. 4, 6, and 7, the detection substrate according to the embodiments of the present disclosure may further include a passivation layer 400 and a planarization layer 500.

The passivation layer 400 may be made of a transparent and insulating material and may cover the thin film transistor 300 and the photosensitive component 100.

A material of the planarization layer 500 may include a resin or other transparent insulating materials, and may cover the passivation layer 400. The planarization layer 500 may be disposed on a side of the passivation layer 400 away from the base substrate 200, and a surface of the planarization layer 500 away from the substrate 200 is a flat surface.

In the detection substrate according to the embodiments of the present disclosure, the photosensitive component 100 according to the above embodiments are used, so that the area for receiving light is enlarged, the photocurrent may be increased, thus it is advantageous for increasing the signal-to-noise ratio of the detection substrate, thereby improving the detecting effect.

In the above embodiments, the thin film transistor 300 is a bottom gate type thin film transistor. However, the present disclosure is not limited thereto. In other embodiments of the present disclosure, thin film transistors of other structures, such as "top gate type" thin film transistor, "dual gate type" thin film transistor, or the like, may be used.

Figure 8:
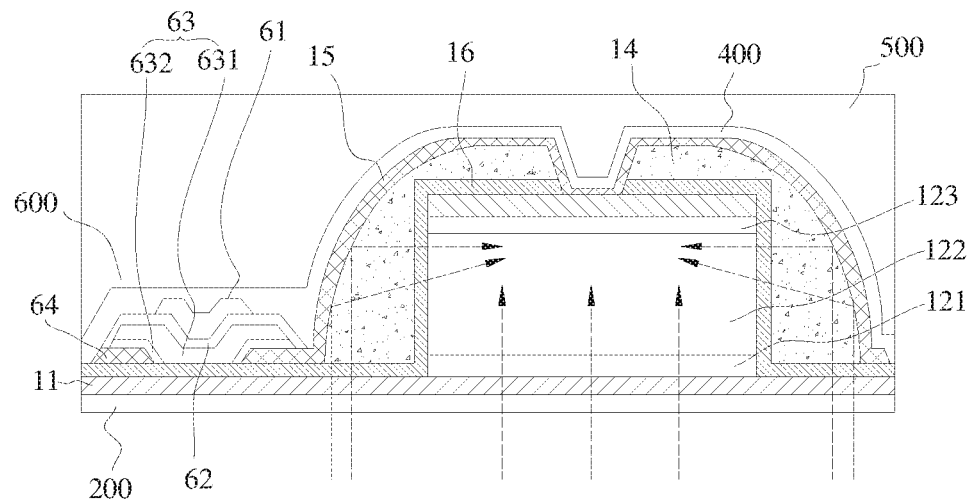
FIG. 8 is a schematic cross-sectional view of a detection substrate in which a thin film transistor is a top gate type thin film transistor, according to some embodiments of the present disclosure.

FIG. 8 shows a schematic structural view of a detection substrate according to some embodiments of the present disclosure. As shown in FIG. 8, the detection substrate may include a base substrate 200, a thin film transistor 600, and the photosensitive component 100 according to any one of the above embodiments. It should be noted that, unless otherwise specified, the structure of the detection substrate shown in FIG. 8 is substantially the same as that described in the foregoing embodiments, except differences which are mainly described below.

The thin film transistor 600 may be a top gate type thin film transistor formed on the base substrate 200. For example, the thin film transistor 600 may include a gate electrode 61, a gate insulating layer 62, an active layer 63, and a source/drain electrode 64.

Specifically, the source/drain electrode 64 may be disposed on the side of the base substrate 200 on which the photosensitive component 100 is disposed. For example, as shown in FIG. 8, the protective layer 16 of the photosensitive component 100 may extend along the first electrode layer 11 in a direction away from the photoelectric conversion layer 12, and the source/drain electrode 64 may be formed on the protective layer 16. Specifically, both the first electrode layer 11 and the protective layer 16 extend along the first electrode layer 11 in the direction away from the photoelectric conversion layer 12, and the orthographic projection of the combination of the protective layer 16 and the via hole 141 formed therein on the base substrate 200 covers the orthographic projection of the first electrode layer 11 on the base substrate 200. The source/drain electrode 64 is formed on the protective layer 16, and an orthographic projection of the source/drain electrode 64 on the base substrate 200 falls within the orthographic projection of the protective layer 16 on the base substrate 200. In the embodiments, the protective layer 16 functions to electrically isolate the first electrode layer 11 from the source/drain electrode 64.

Similarly, similarly to FIG. 6, in the case where the protective layer 16 is not formed separately, the first electrode layer 11 and the insulating layer 14 may both extend along the first electrode layer 11 in the direction away from the photoelectric conversion layer 12, and the orthographic projection of the combination of the insulating layer 14 and the via hole 141 formed therein on the base substrate 200 covers the orthographic projection of the first electrode layer 11 on the base substrate 200. The source/drain electrode 64 is formed on the insulating layer 14, and the orthographic projection of the source/drain electrode 64 on the base substrate 200 falls within the orthographic projection of the insulating layer 14 on the base substrate 200. In the embodiments, the insulating layer 14 functions to electrically isolate the first electrode layer 11 from the source/drain electrode 64.

Optionally, similar to FIG. 7, the first electrode layer 11, the protective layer 16, or the insulating layer 14 may not completely cover the base substrate 200, and the source/drain electrode 64 may be directly formed on the base substrate 200. That is, the orthographic projection of the source/drain electrode 64 on the base substrate 200 does not overlap with the orthographic projection of any one of the first electrode layer 11, the insulating layer 14, and the protective layer 16 on the base substrate 200.

For example, the source/drain electrode 64 and the reflective layer 15 are located in the same layer. For example, the source/drain electrode 64 and the reflective layer 15 may be formed through the same one patterning process (for example, a patterning process using a mask), or may be separately formed.

The active layer 63 may be disposed on a side of the source/drain electrode 64 away from the substrate 200. Moreover, the active layer 63 may be made of a semiconductor material, and it may include an amorphous silicon layer 631 and a doped amorphous silicon layer 632, and the amorphous silicon layer 631 may be located between the doped amorphous silicon layer 632 and the gate insulating layer 62. The gate electrode 61 is disposed on a side of the gate insulating layer 62 away from the active layer 63.

The source/drain electrode 64 may be made of a metal material and include a source electrode and a drain electrode. The source electrode or drain electrode may be connected to the reflective layer 15 of the photosensitive component 100. For example, in the illustrated embodiments, the drain electrode of the source/drain electrode 64 may be connected to the reflective layer 15. For example, the reflective layer 15 is formed of a conductive material, and the drain electrode is electrically connected to the second electrode layer 13 by means of the conductive reflective layer 15, so that an electrical signal output from the second electrode layer may be transmitted to the drain electrode of the thin film transistor. Specifically, when the detection substrate is in use, after the photodiode detects the visible light, the visible light is converted into the electrical signal, and then the second electrode layer 13 transmits the electrical signal to the drain electrode of the thin film transistor 600.

Figure 9:
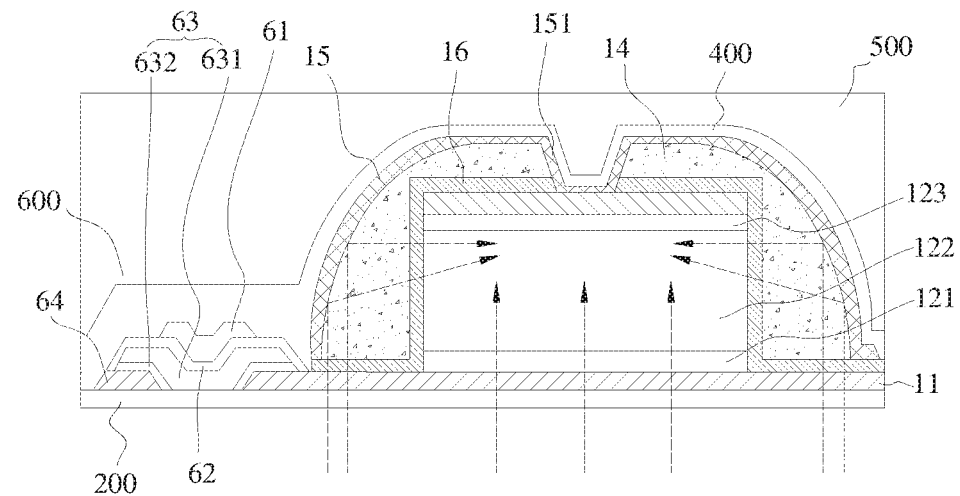
FIG. 9 is a schematic cross-sectional view of a detection substrate in which a thin film transistor is a top gate type thin film transistor and a drain electrode of the thin film transistor is located in the same layer as a first electrode layer of a photosensitive component, according to some embodiments of the present disclosure.

FIG. 9 shows a schematic structural view of a detection substrate according to some embodiments of the present disclosure. As shown in FIG. 9, the detection substrate may include a base substrate 200, a thin film transistor 600, and the photosensitive component 100 according to any one of the above embodiments. It should be noted that, unless otherwise specified, the structure of the detection substrate shown in FIG. 9 is substantially the same as that described in the foregoing embodiments, except differences which are mainly described below.

The thin film transistor 600 may be a top gate type thin film transistor formed on the base substrate 200. For example, the thin film transistor 600 may include a gate electrode 61, a gate insulating layer 62, an active layer 63, and a source/drain electrode 64.

Specifically, the source/drain electrode 64 may be disposed on the side of the base substrate 200 on which the photosensitive component 100 is disposed. The source/drain electrode 64 and the first electrode layer 11 may be located in the same layer, for example, they may be formed through the same one patterning process. For example, as shown in FIG. 9, both the source/drain electrode 64 and the first electrode layer 11 are formed directly on a surface of the base substrate 200 facing the photoelectric conversion layer 12.

The source/drain electrode 64 includes a source electrode and a drain electrode, whose material may be the same as that of the first electrode layer 11. The source electrode or the drain electrode may be connected to the first electrode layer 11 of the photosensitive component 100. For example, in the illustrated embodiments, the drain electrode of the source/drain electrode 64 may be connected to the first electrode layer 11. Thus, the electrical signal output by the first electrode layer may be transmitted to the drain electrode of the thin film transistor. Specifically, when the detection substrate is in use, after the photodiode detects the visible light, the visible light is converted into the electrical signal, and then the first electrode layer 11 transmits the electrical signal to the drain electrode of the thin film transistor 600.

Optionally, in the embodiments, the reflective layer 15 may be formed of a conductive material, and the reflective layer 15 is electrically connected to the second electrode layer 13 through the conductive plug 151. In this way, an external electrical signal may be supplied to the second electrode layer 13 through the conductive reflective layer 15. Therefore, the reflective layer 15 is not only used to reflect at least a part of the light entering the insulating layer 14 to the side surfaces of the photoelectric conversion layer 12, but also may be used as a lead-out wire of the second electrode layer 13.

Figure 10:
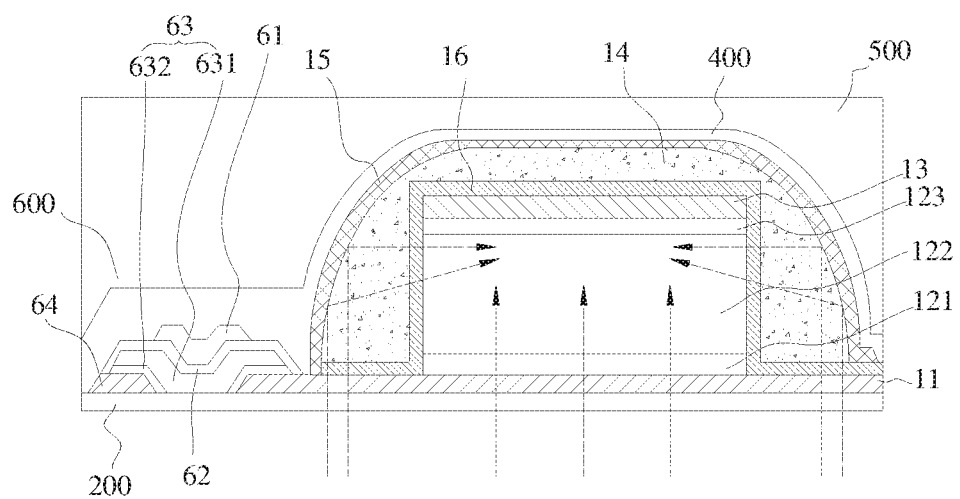
FIG. 10 is a schematic cross-sectional view of a detection substrate in which a thin film transistor is a top gate type thin film transistor and a reflective layer of a photosensitive component is not electrically connected to a second electrode layer, according to some embodiments of the present disclosure.

FIG. 10 shows a schematic structural view of a detection substrate according to some embodiments of the present disclosure. As shown in FIG. 10, the detection substrate may include a base substrate 200, a thin film transistor 600, and the photosensitive component 100 according to any one of the above embodiments. It should be noted that, unless otherwise specified, the structure of the detection substrate shown in FIG. 10 is substantially the same as that described in the foregoing embodiments, except differences which are mainly described below.

In the embodiments, the source/drain electrode 64 and the first electrode layer 11 may be in the same layer, for example, they may be formed through the same one patterning process. For example, as shown in FIG. 10, both the source/drain electrode 64 and the first electrode layer 11 are formed directly on the surface of the base substrate 200 facing the photoelectric conversion layer 12.

In the embodiments shown in FIG. 10, it is not necessary to form an electrical connection between the reflective layer 15 and the second electrode layer 13. For example, an external electrical signal may be supplied to the second electrode layer 13 through other lead-out wires. Thus, it is not necessary to form the via hole in the insulating layer 14 and the protective layer 16, so that the manufacturing process may be simplified.

For example, the reflective layer 15 may be made of an insulating material, and the reflective layer 15 made of the insulating material may reflect at least a part of the light entering the insulating layer 14 to the side surfaces of the photoelectric conversion layer 12.

Figure 11:
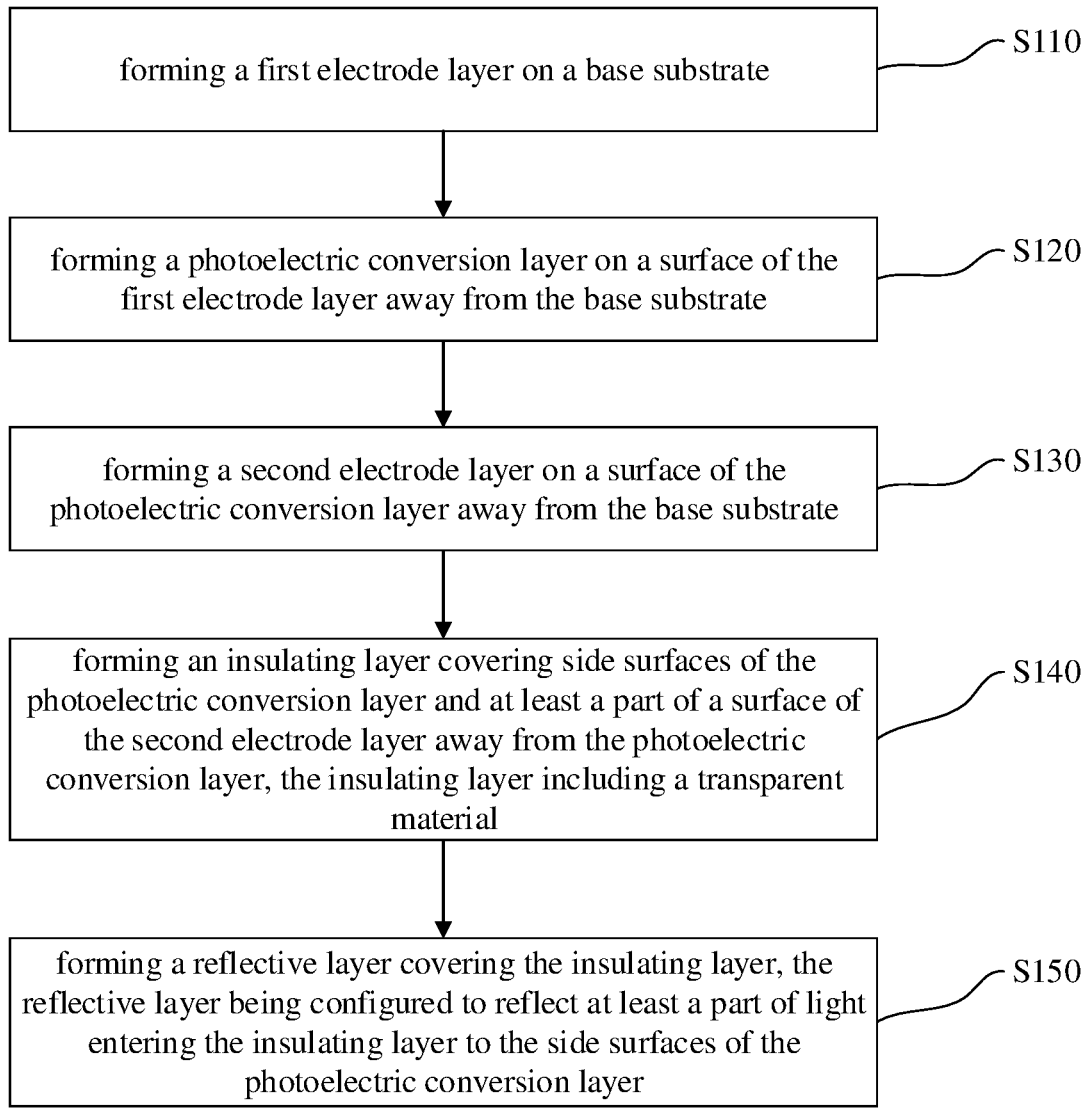
FIG. 11 is a flowchart of a method for manufacturing a detection substrate according to some embodiments of the present disclosure.

The embodiments of the present disclosure further provide a method for manufacturing a detection substrate. As shown in FIG. 11, the method may include:

step S110, forming a first electrode layer on a base substrate;

step S120, forming a photoelectric conversion layer on a surface of the first electrode layer away from the base substrate;

step S130, forming a second electrode layer on a surface of the photoelectric conversion layer away from the base substrate;

step S140, forming an insulating layer, the insulating layer covering side surfaces of the photoelectric conversion layer and at least a part of a surface of the second electrode layer away from the photoelectric conversion layer, and the insulating layer including a transparent material; and step S150, forming a reflective layer covering the insulating layer, the reflective layer being configured to reflect at least a part of light entering the insulating layer to the side surfaces of the photoelectric conversion layer.

Beneficial effects of the method for manufacturing the detection substrate according to the embodiments of the present disclosure may be referred to beneficial effects of the photosensitive component 100 and the detection substrate according to the above embodiments, and will not be described in detail herein.

Steps of the method for manufacturing the detection substrate according to the embodiments of the present disclosure will be described in detail below.

Figure 12:
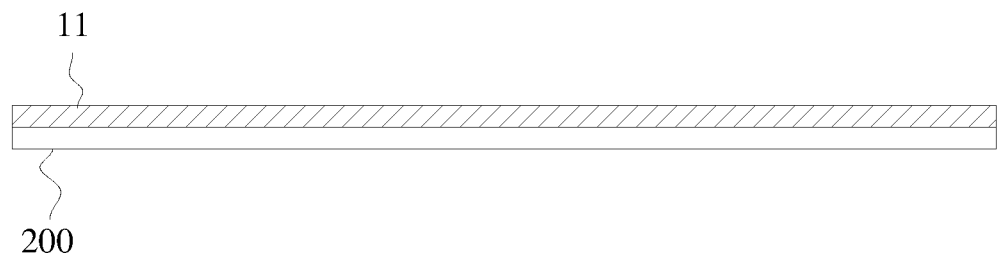
FIG. 12 is a schematic cross-sectional view of a detection substrate formed after step S110 in the method according to some embodiments of the present disclosure is performed.

As shown in FIG. 12, in step S110, the first electrode layer 11 may be formed on the base substrate 200 through a process such as physical or chemical vapor deposition, and the material of the first electrode layer 11 may include a transparent conductive material such as ITO.

Figure 13:
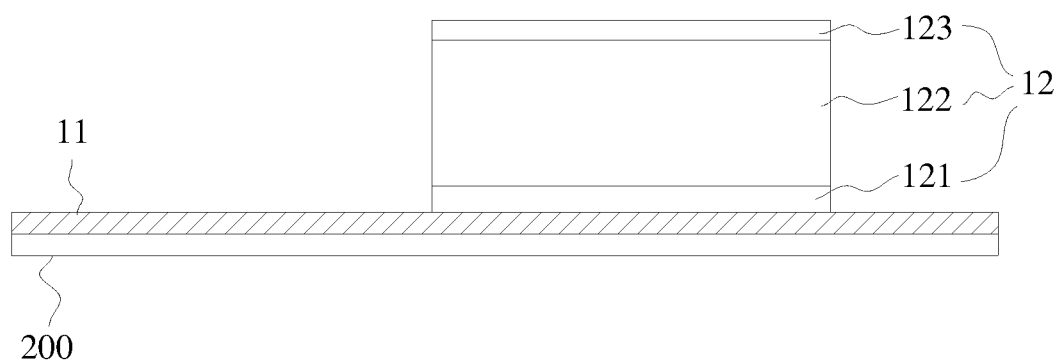
FIG. 13 is a schematic cross-sectional view of a detection substrate formed after step S120 in the method according to some embodiments of the present disclosure is performed.

As shown in FIG. 13, in step S120, the photoelectric conversion layer 12 may be formed on the surface of the first electrode layer 11 away from the base substrate 200 through a process such as deposition, mask, or the like. For example, the photoelectric conversion layer 12 may include a first semiconductor layer 121, an intrinsic semiconductor layer 122, and a second semiconductor layer 123 which are disposed in a stacked manner. The step of forming the photoelectric conversion layer 12 may include: sequentially depositing the first semiconductor layer 121, the intrinsic semiconductor layer 122, and the second semiconductor layer 123 on the first electrode layer 11, and then forming a pattern of the photoelectric conversion layer 12 through an etching process. Of course, it is also possible to form a pattern of the first semiconductor layer 121, then forming a pattern of the intrinsic semiconductor layer 122, and then forming a pattern of the second semiconductor layer 123, as long as the photoelectric conversion layer 12 is formed.

Figure 14:
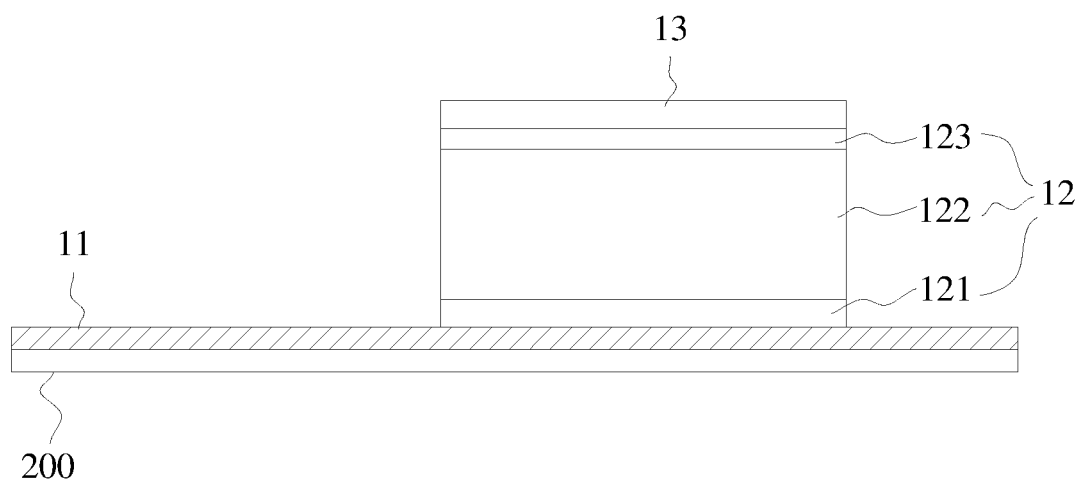
FIG. 14 is a schematic cross-sectional view of a detection substrate formed after step S130 in the method according to some embodiments of the present disclosure is performed.

As shown in FIG. 14, in step S130, the second electrode layer 13 is formed on the photoelectric conversion layer 12. The process for forming the second electrode layer 13 may be the same as that of the first electrode layer 11, and the material of the second electrode layer 13 may be the same as that of the first electrode layer 11, and will not be described in detail herein. Moreover, the second electrode layer 13 may be formed on the surface of the photoelectric conversion layer 12 away from the base substrate 200.

The second electrode layer 13 and the photoelectric conversion layer 12 may be formed through one etching process. For example, the first semiconductor layer 121, the intrinsic semiconductor layer 122, and the second semiconductor layer 123, and the second electrode layer 13 may be sequentially deposited on the first electrode layer 11 to be stacked on one another, and then a pattern of the photoelectric conversion layer 12 and a pattern of the second electrode layer 13 may be formed through one etching process. Of course, it is possible to form the pattern of the second electrode layer 13 after the pattern of the photoelectric conversion layer 12 is formed.

Figure 15:
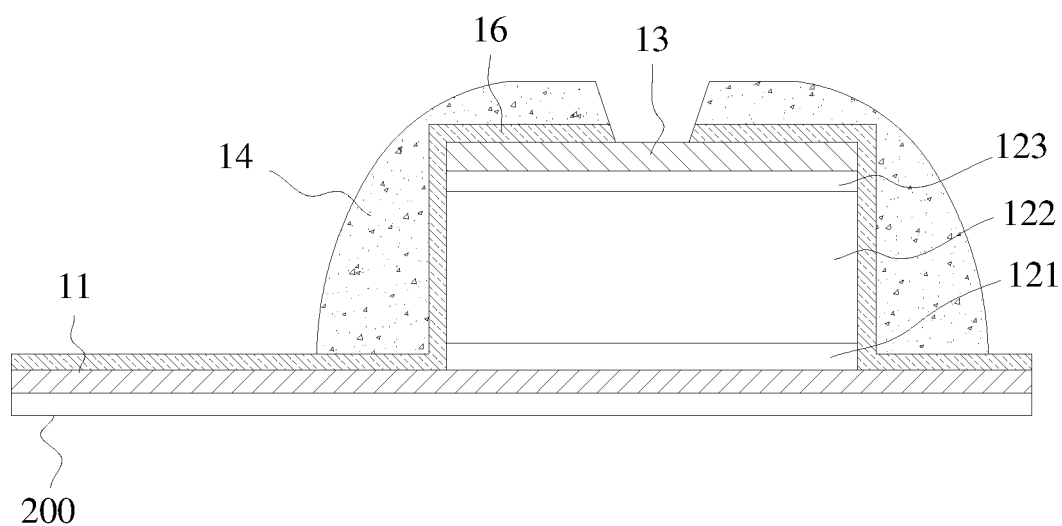
FIG. 15 is a schematic cross-sectional view of a detection substrate formed after step S140 in the method according to some embodiments of the present disclosure is performed.

As shown in FIG. 15, in step S140, the insulating layer 14 may cover the side surfaces of the photoelectric conversion layer 12 and at least a part of the surface of the second electrode layer 13 away from the photoelectric conversion layer 12. The specific structure of the insulating layer may refer to that of the insulating layer 14 in the above-mentioned photosensitive component 100, which will not be described in detail herein.

Optionally, in step S140, a protective layer 16 may also be formed, and the protective layer 16 may cover the side surfaces of the photoelectric conversion layer 12 and at least a part of the surface of the second electrode layer 13 away from the photoelectric conversion layer 12. The specific structure of the protective layer may refer to that of the protective layer 16 in the above-mentioned photosensitive component 100, which will not be described in detail herein.

Figure 16:
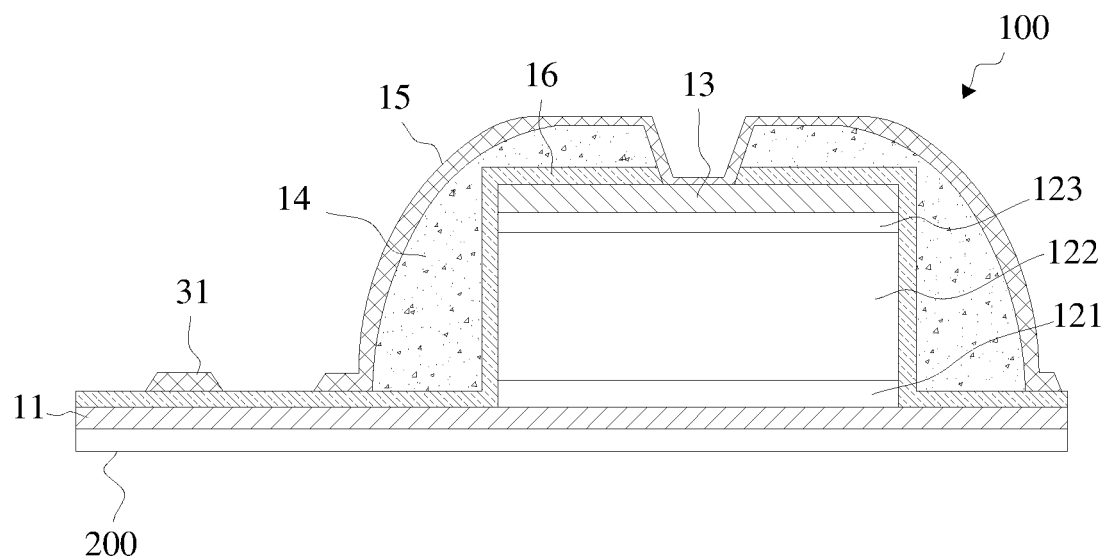
FIG. 16 is a schematic cross-sectional view of a detection substrate formed after step S150 and step S1610 in the method according to some embodiments of the present disclosure are performed.

As shown in FIG. 16, in step S150, the reflective layer 15 may directly cover the insulating layer 14. The shape of the reflective layer 15 may conform to the outer surface of the insulating layer 14, so that at least a part of the light entering the insulating layer 14 may be reflected to the side surfaces of the photoelectric conversion layer 12. The specific structure of the reflective layer may refer to that of the reflective layer 15 in the above-mentioned photosensitive component 100, which will not be described in detail herein.

The method for manufacturing the detection substrate according to the embodiments of the present disclosure may further include: step S160, forming a thin film transistor 300.

The thin film transistor 300 may be formed on a side of the base substrate 200 on which the photosensitive component 100 is disposed, and may be connected to the photosensitive component 100 so as to receive an electrical signal output from the photosensitive component 100.

Specifically, the step S160 for forming the thin film transistor 300 may include the following steps S1610, S1620, S1630, and S1640.

Figure 17:
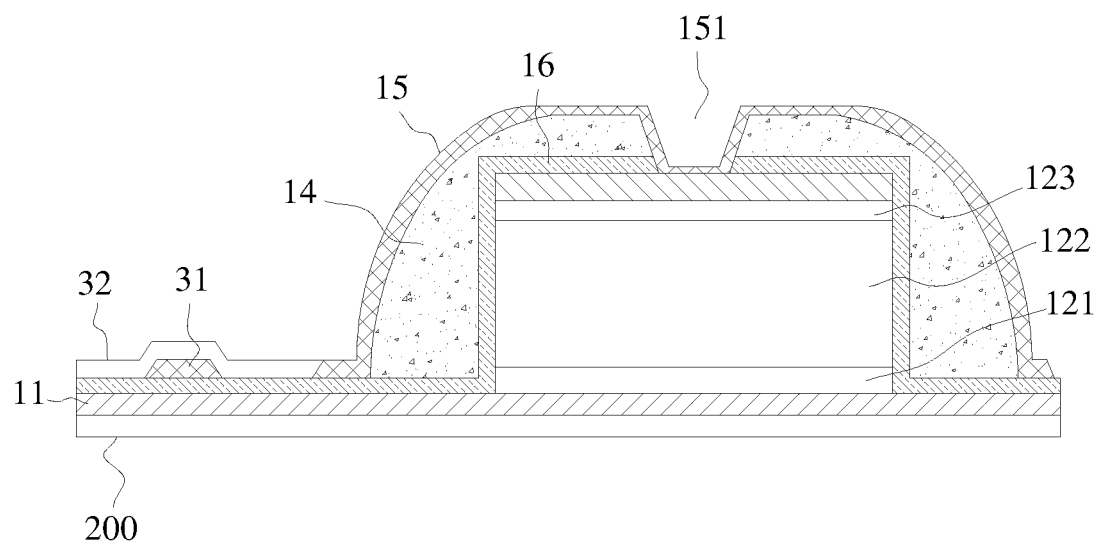
FIG. 17 is a schematic cross-sectional view of a detection substrate formed after step S1620 in the method according to some embodiments of the present disclosure is performed.

In step S1610, as shown in FIG. 17, a gate electrode 31 is formed on the side of the base substrate 200 on which the photosensitive component 100 is disposed.

The gate electrode 31 may be located on a side of the first electrode layer 11 away from the base substrate 200, for example, on the surface of the protective layer 16 away from the first electrode layer 11. Of course, the gate electrode 31 may also be directly formed on the surface of the base substrate 200. Moreover, the gate electrode 31 and the reflective layer 15 may be formed through the same one patterning process, that is, step S1610 and step S150 are performed simultaneously, and of course, they may also be formed separately.

As shown in FIG. 17, in step S1620, a gate insulating layer 32 covering the gate electrode 31 is formed on the gate electrode 31.

Figure 18:
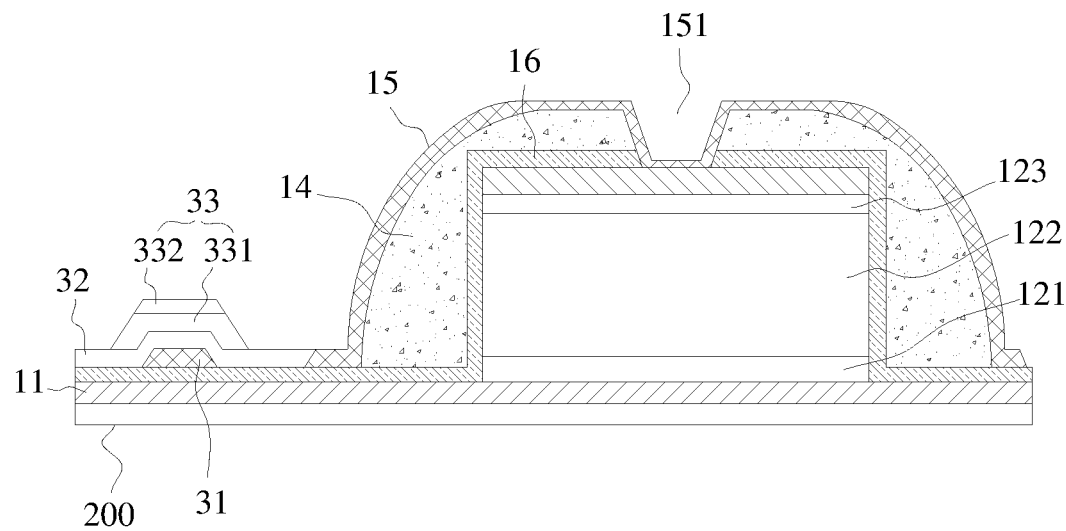
FIG. 18 is a schematic cross-sectional view of a detection substrate formed after step S1630 in the method according to some embodiments of the present disclosure is performed.

As shown in FIG. 18, in step S1630, the active layer 33 is formed on the side of the gate insulating layer 32 away from the first electrode layer 11. The active layer 33 may include an amorphous silicon layer 331 and a doped amorphous silicon layer 332, and the amorphous silicon layer 331 is located between the doped amorphous silicon layer 332 and the gate insulating layer 32.

For example, the gate insulating layer 32 and the active layer 33 may be formed through the same one etching process, that is, the gate insulating layer 32 and the active layer 33 may be sequentially deposited, and then a pattern of the gate insulating layer 32 and a pattern of the active layer 33 are formed through the same one etching process.

Figure 19:
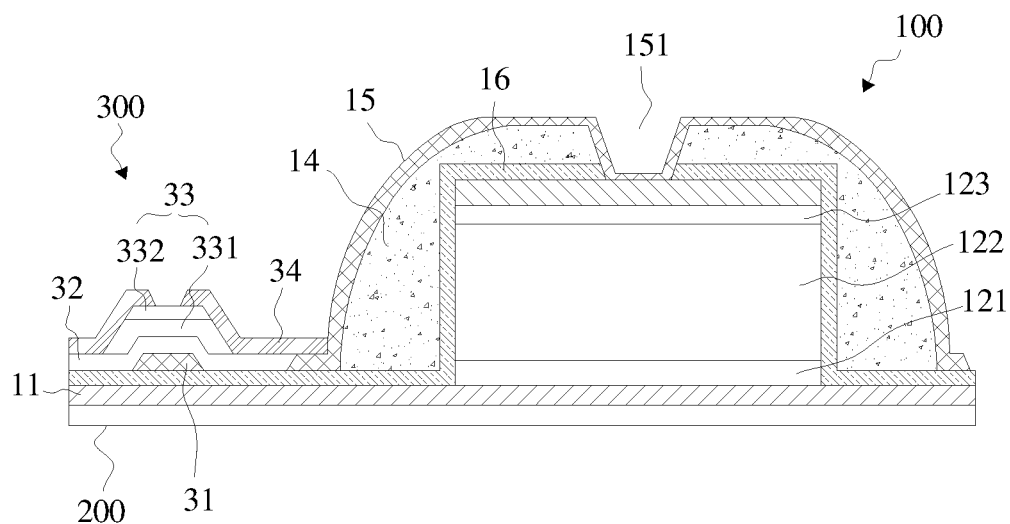
FIG. 19 is a schematic cross-sectional view of a detection substrate formed after step S1640 in the method according to some embodiments of the present disclosure is performed.

As shown in FIG. 19, in step S1640, the source/drain electrode 34 is formed on the side of the active layer 33 away from the gate electrode 31.

In the above method, the step for manufacturing the active layer of the thin film transistor follows the step for manufacturing the semiconductor layer of the photoelectric conversion layer, and the semiconductor layer of the photoelectric conversion layer typically includes amorphous silicon, in this way, it is advantageous to prevent hydrogen in the semiconductor layer of the photoelectric conversion layer from diffusing into the active layer of the thin film transistor, thereby avoiding deterioration of characteristics of the active layer.

The method for manufacturing the detection substrate according to the embodiments of the present disclosure may further include the following steps S170 and S180.

Figure 20:
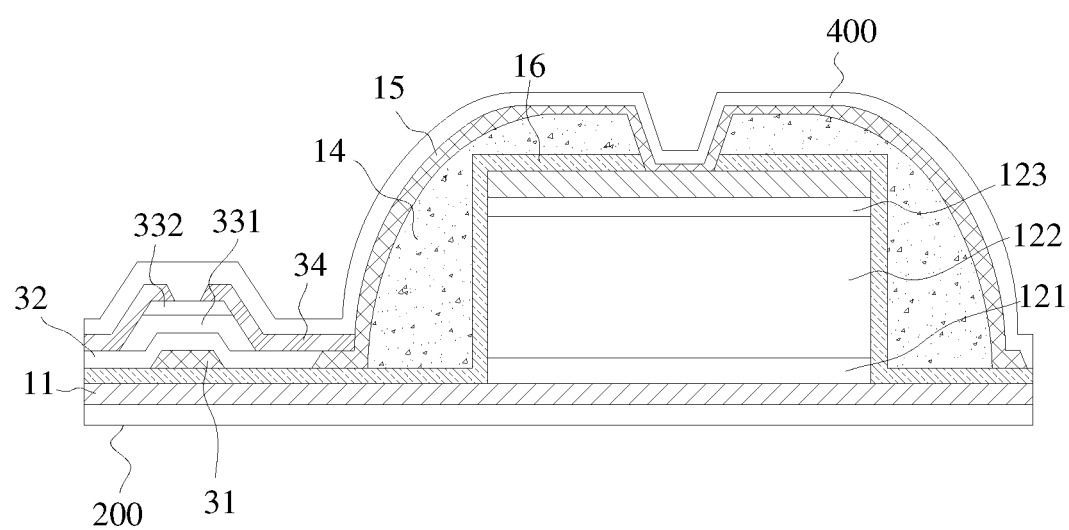
FIG. 20 is a schematic cross-sectional view of a detection substrate formed after step S170 in the method according to some embodiments of the present disclosure is performed.

As shown in FIG. 20, in step S170, a passivation layer 400 covering both the reflective layer 15 and the thin film transistor 300 is formed.

The passivation layer 400 may be made of an inorganic insulating material such as an oxide or nitride of silicon. Of course, other insulating and corrosion resistant materials are also possible.

As shown in FIG. 4, in step S180, a planarization layer 500 is formed on the passivation layer 400.

A material of the planarization layer 500 may include a resin or other transparent insulating materials, the planarization layer 500 is located at a side of the passivation layer away from the base substrate 200, and a surface of the planarization layer 500 away from the base substrate 200 is a flat surface.

It should be noted that the above embodiments mainly describe the method for manufacturing the detection substrate shown in FIG. 4 in detail, and those skilled in the art should understand that the method for manufacturing the detection substrate according to the embodiments of the present disclosure may also be applied to manufacture the detection substrates shown in FIG. 6 to FIG. 10.

Optionally, in the method according to the embodiments of the present disclosure, the source electrode and the drain electrode of the thin film transistor may be formed through the same one patterning process as the reflective layer of the photosensitive component.

Optionally, in the method according to the embodiments of the present disclosure, the source electrode and the drain electrode of the thin film transistor may be formed through the same one patterning process as the first electrode layer of the photosensitive component.

Figure 21:
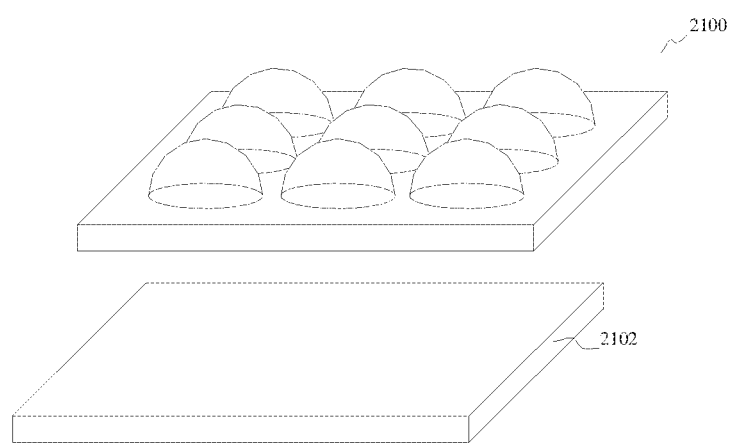
FIG. 21 is a schematic view of a detector according to some embodiments of the present disclosure.

As shown in FIG. 21, some embodiments of the present disclosure further provide a detector 2100, which may be a flat panel detector, and the detector may include the detection substrate according to the above embodiments. Also, the detector may further include structures, such as a scintillator layer or a phosphor layer 2102, disposed on the detection substrate.

Other embodiments of the present disclosure will be apparent to those skilled in the art based on considering and embodying the above embodiments. The present disclosure is intended to cover any variations, uses, or adaptations of the above embodiments, and these variations, uses, or adaptations shall conform to general principles of the present disclosure and include common knowledge or common technical means in the art that are not disclosed in the present disclosure. The specification and embodiments are to be regarded as illustrative only. The scope and spirit of the present disclosure shall be defined by appended claims.

What is claimed is:

1. A photosensitive component comprising:
   a first electrode layer;
   a photoelectric conversion layer on the first electrode layer;
   a second electrode layer on a surface of the photoelectric conversion layer away from the first electrode layer;
   an insulating layer covering side surfaces of the photoelectric conversion layer and at least a part of a surface of the second electrode layer away from the photoelectric conversion layer, the insulating layer comprising a transparent material; and a reflective layer covering the insulating layer, the reflective layer being configured to reflect at least a part of light entering the insulating layer to the side surfaces of the photoelectric conversion layer, wherein a surface of the reflective layer opposite to the side surfaces of the photoelectric conversion layer is convex in a direction away from the photoelectric conversion layer.

2. The photosensitive component according to claim 1, wherein the surface of the reflective layer opposite to the side surfaces of the photoelectric conversion layer is an arc surface.

3. The photosensitive component according to claim 2, further comprising a conductive plug between the reflective layer and the second electrode layer, wherein the reflective layer is electrically connected to the second electrode layer through the conductive plug.

4. A detection substrate, comprising:
a base substrate; and
the photosensitive component according to claim 2,
wherein the first electrode layer is disposed on the base substrate.

5. The photosensitive component according to claim 1, further comprising a conductive plug between the reflective layer and the second electrode layer, wherein the reflective layer is electrically connected to the second electrode layer through the conductive plug.

6. The photosensitive component according to claim 1, further comprising a protective layer covering the side surfaces of the photoelectric conversion layer and the at least a part of the surface of the second electrode layer away from the photoelectric conversion layer, the insulating layer covering the protective layer.

7. The photosensitive component according to claim 1, wherein a material of the reflective layer comprises metal.

8. A detection substrate, comprising:
a base substrate; and
the photosensitive component according to claim 1,
wherein the first electrode layer is disposed on the base substrate.

9. The detection substrate according to claim 8, wherein the detection substrate further comprises a thin film transistor connected to the photosensitive component, the thin film transistor comprising a gate electrode, a source electrode and a drain electrode.

10. The detection substrate according to claim 9, wherein the photosensitive component further comprises a conductive plug between the reflective layer and the second electrode layer, and the reflective layer is electrically connected to the second electrode layer through the conductive plug.

11. The detection substrate according to claim 10, wherein one of the source electrode or the drain electrode is electrically connected to the reflective layer.

12. The detection substrate according to claim 11, wherein the thin film transistor further comprises a gate insulating layer and an active layer, the gate electrode is disposed on the base substrate, the gate insulating layer is disposed on a side of the gate electrode away from the base substrate, the active layer is disposed on a side of the gate insulating layer away from the gate electrode, and the source electrode and the drain electrode are disposed on a side of the active layer away from the gate insulating layer; and wherein the gate electrode and the reflective layer are located in the same layer, or both the source electrode and the drain electrode are located in the same layer as the reflective layer.

13. The detection substrate according to claim 11, wherein the thin film transistor further comprises a gate insulating layer and an active layer, the source electrode and the drain electrode are disposed on the base substrate, the active layer is disposed on a side of both the source electrode and the drain electrode away from the base substrate, the gate insulating layer is disposed on a side of the active layer away from the base substrate, and the gate electrode is disposed on a side of the gate insulating layer away from the active layer; and wherein both the source electrode and the drain electrode are located in the same layer as the reflective layer.

14. A detector, comprising the detection substrate according to claim 8, and further comprising:
a scintillator layer or a phosphor layer disposed on the detection substrate.

15. A method for manufacturing a detection substrate, wherein the method comprises:
forming a first electrode layer on a base substrate;
forming a photoelectric conversion layer on a surface of the first electrode layer away from the base substrate;
forming a second electrode layer on a surface of the photoelectric conversion layer away from the base substrate;
forming an insulating layer covering side surfaces of the photoelectric conversion layer and at least a part of a surface of the second electrode layer away from the photoelectric conversion layer, the insulating layer comprising a transparent material; and
forming a reflective layer covering the insulating layer, the reflective layer being configured to reflect at least a part of light entering the insulating layer to the side surfaces of the photoelectric conversion layer,
wherein a surface of the reflective layer opposite to the side surfaces of the photoelectric conversion layer is convex in a direction away from the photoelectric conversion layer.

* * * * *